(12) United States Patent
Russ et al.

(10) Patent No.: US 12,183,730 B2
(45) Date of Patent: Dec. 31, 2024

(54) SILICON CONTROLLED RECTIFIER

(71) Applicant: Infineon Technologies AG, Neubiberg (DE)

(72) Inventors: Christian Cornelius Russ, Diedorf (DE); Gabriel-Dumitru Cretu, Munich (DE); Filippo Magrini, Munich (DE)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 18/520,908

(22) Filed: Nov. 28, 2023

(65) Prior Publication Data

US 2024/0096875 A1 Mar. 21, 2024

Related U.S. Application Data

(62) Division of application No. 17/892,601, filed on Aug. 22, 2022, now Pat. No. 11,869,885, which is a division of application No. 16/918,384, filed on Jul. 1, 2020, now Pat. No. 11,508,717.

(30) Foreign Application Priority Data

Jul. 3, 2019 (EP) .................................. 19184043

(51) Int. Cl.
*H01L 27/02* (2006.01)
*H01L 29/74* (2006.01)

(52) U.S. Cl.
CPC ...... *H01L 27/0262* (2013.01); *H01L 29/7408* (2013.01)

(58) Field of Classification Search
CPC ............. H01L 27/0262; H01L 27/0248; H01L 27/0259
See application file for complete search history.

(56) References Cited

U.S. PATENT DOCUMENTS

| 5,343,053 | A | 8/1994 | Avery |
| 5,808,342 | A | 9/1998 | Chen et al. |
| 6,249,414 | B1 | 6/2001 | Lee et al. |
| 7,566,914 | B2 | 7/2009 | Salcedo et al. |

(Continued)

FOREIGN PATENT DOCUMENTS

| FR | 2904473 A1 | 2/2008 |
| WO | 2015056040 A1 | 4/2015 |

*Primary Examiner* — Wasiul Haider
(74) *Attorney, Agent, or Firm* — Murphy, Bilak & Homiller, PLLC

(57) ABSTRACT

A silicon-controlled rectifier includes a semiconductor body including a first main surface, an active device region, a first, a second, a third and a fourth surface contact area at the first main surface and arranged directly one after another along a first lateral direction, wherein the semiconductor body is electrically contacted at each of the first to fourth surface contact areas, and a first, a second, a third and a fourth SCR region, wherein the first and third SCR regions are of a first conductivity type and directly adjoin the first and third surface contact areas, respectively, and wherein the second and fourth SCR regions are of a second conductivity type and directly adjoin the second and fourth surface contact areas, respectively, wherein the first SCR region is electrically connected to the fourth SCR region, and the second SCR region is electrically connected to the third SCR region.

7 Claims, 5 Drawing Sheets

(56) References Cited

U.S. PATENT DOCUMENTS

| | | |
|---|---|---|
| 7,834,378 B2 | 11/2010 | Ryu et al. |
| 7,843,009 B2 | 11/2010 | Brunel et al. |
| 8,841,727 B1 | 9/2014 | Walker et al. |
| 9,613,946 B2 | 4/2017 | Zhong et al. |
| 2002/0115250 A1 | 8/2002 | Jiang et al. |
| 2003/0042498 A1* | 3/2003 | Ker .................... H01L 29/7436 257/361 |
| 2006/0071236 A1 | 4/2006 | Jensen et al. |
| 2007/0007545 A1 | 1/2007 | Salcedo et al. |
| 2008/0048208 A1 | 2/2008 | Brunel et al. |
| 2016/0276335 A1 | 9/2016 | Laine et al. |
| 2017/0287894 A1 | 10/2017 | Kuo et al. |
| 2018/0323184 A1 | 11/2018 | Hung et al. |

* cited by examiner

SILICON CONTROLLED RECTIFIER

TECHNICAL FIELD

The present disclosure is related to semiconductor devices, in particular to silicon controlled rectifiers, SCRs (thyristors).

BACKGROUND

Components such as transistors, diodes, resistors, electro-optical devices, precision film resistors and a variety of integrated circuits are all sensitive to Electrostatic Discharge (ESD), and as electronics manufacturers drive to miniaturize devices and improve operating speeds, susceptibility of devices to ESD is increasing. Devices are subject to ESD damage at every stage of production: from wafer fabrication to populated circuit boards in sub-assemblies and assemblies. Also during operation of components or integrated circuits unwanted voltage pulses may arise. In automotive chips, unwanted voltage pulses may be caused by the vehicle wiring any may damage sensitive subsystems such as safety systems, control modules and infotainment equipment. Pulses can be caused by events such as electrostatic discharges (ESD) from occupants, turn-on/off of subsystems such as motor drives or climate control, or load dumps when a significant load such as the battery is suddenly disconnected. For avoiding damage to integrated circuits or electronic devices by pulses during assembly or operation, ESD protection devices, e.g. SCRs are connected between pins of an integrated circuit in order to prevent a malfunction or breakdown of circuits connected between the pins by pulses. Compact design of ESD protection devices is desirable for minimizing chip area required for ESD protection.

There is a need to improve silicon controlled rectifiers for ESD protection.

SUMMARY

An example of the present disclosure relates to a silicon controlled rectifier. The SCR includes a semiconductor body having a first main surface. The SCR further includes an active device region. The SCR further includes a first, a second, a third and a fourth surface contact area at the first main surface arranged directly one after another along a first lateral direction. The semiconductor body is electrically contacted at each of the first to fourth surface contact areas. The SCR further includes a first, a second, a third and a fourth SCR region. The first and third SCR regions are of a first conductivity type and directly adjoin the first and third surface contact area, respectively. The second and fourth SCR regions are of a second conductivity type and directly adjoin the second and fourth surface contact area, respectively. The SCR further includes a first well region of the first conductivity type. The second SCR region at least partially overlaps the first well region at the first main surface. The first SCR region at most partially overlaps the first well region at the first main surface. The first SCR region is electrically connected to the second SCR region. The third SCR region is electrically connected to the fourth SCR region.

Another example of the present disclosure relates to another silicon controlled rectifier. The SCR includes a semiconductor body having a first main surface. The SCR further includes an active device region. The SCR further includes a first, a second, a third, a fourth and a fifth surface contact area at the first main surface. The first, second, fifth, third and fourth surface contact area are arranged directly one after another along a first lateral direction. The semiconductor body is electrically contacted at each of the first to fifth surface contact areas. The SCR further includes a first, a second, a third and a fourth SCR region. The first and third SCR regions are of a first conductivity type and directly adjoin the first and third surface contact area, respectively. The second and fourth SCR regions are of a second conductivity type and directly adjoin the second and fourth surface contact area, respectively. The SCR further includes a trigger region of the first conductivity type that directly adjoins the fifth surface contact area. The SCR further includes a first well region of the first conductivity type. The second SCR region at least partially overlaps the first well region at the first main surface. The first SCR region at most partially overlaps the first well region at the first main surface. The first SCR region is electrically connected to the second SCR region. The third SCR region is electrically connected to the fourth SCR region.

Another example of the present disclosure relates to another silicon controlled rectifier. The SCR includes a semiconductor body having a first main surface. The SCR further includes an active device region. The SCR further includes a first, a second, a third and a fourth surface contact area at the first main surface arranged directly one after another along a first lateral direction. The semiconductor body is electrically contacted at each of the first to fourth surface contact areas. The SCR further includes a first, a second, a third and a fourth SCR region. The first and third SCR regions are of a first conductivity type and directly adjoin the first and third surface contact area, respectively. The second and fourth SCR regions are of a second conductivity type and directly adjoin the second and fourth surface contact area, respectively. The first SCR region is electrically connected to the fourth SCR region. The second SCR region is electrically connected to the third SCR region.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the embodiments and are incorporated in and constitute a part of this specification. The drawings illustrate embodiments of a silicon controlled rectifier and together with the description serve to explain principles of the embodiments. Further embodiments are described in the following detailed description and the claims.

DETAILED DESCRIPTION

Figure 1:
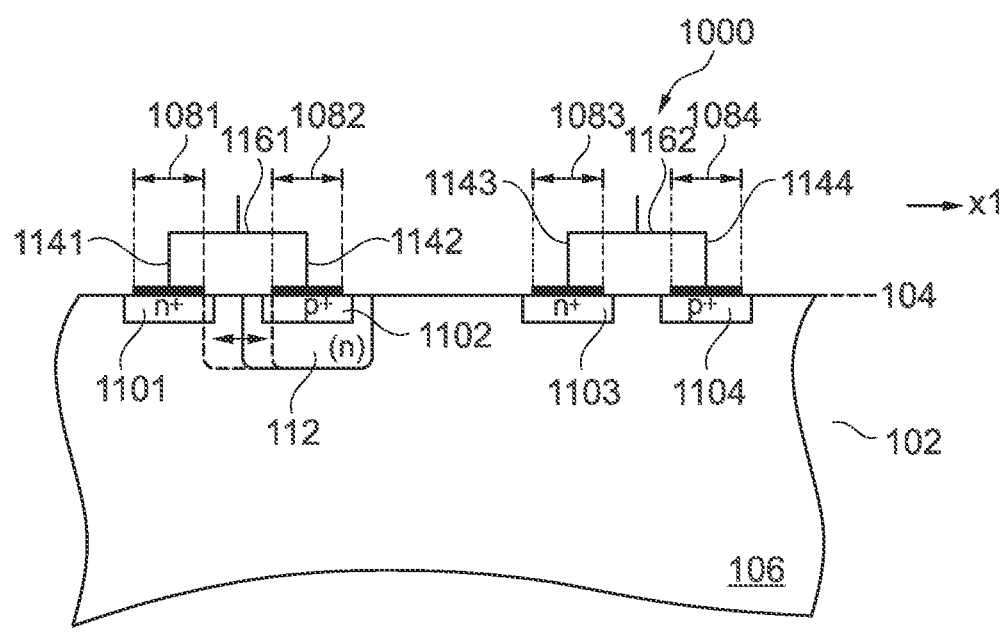
FIG. 1 illustrates a schematic cross-sectional view of an example of a silicon controlled rectifier.

In the following detailed description, reference is made to the accompanying drawings, which form a part thereof and in which are shown by way of illustrations specific embodiments in which a semiconductor device may be practiced. It is to be understood that other embodiments may be utilized and structural or logical changes may be made without departing from the scope of the present disclosure. For example, features illustrated or described for one embodiment can be used on or in conjunction with other embodiments to yield yet a further embodiment. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-resistive connection between electrically connected elements, for example a direct contact between the concerned elements or a low-resistive connection via a metal and/or heavily doped semiconductor material. The term "electrically coupled" includes that one or more intervening element(s) adapted for signal and/or power transmission may be between the electrically coupled elements, for example, elements that are controllable to temporarily provide a low-resistive connection in a first state and a high-resistive electric decoupling in a second state.

The Figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Two adjoining doping regions of the same conductivity type and with different dopant concentrations form a unipolar junction, e.g., an n/n+ or p/p− junction along a boundary surface between the two doping regions. At the unipolar junction a dopant concentration profile orthogonal to the unipolar junction may show a step or a turning point, at which the dopant concentration profile changes from being concave to convex, or vice versa.

Ranges given for physical dimensions include the boundary values. For example, a range for a parameter y from a to b reads as a≤y≤b. A parameter y with a value of at least c reads as c≤y and a parameter y with a value of at most d reads as y≤d.

The term "on" is not to be construed as meaning only "directly on". Rather, if one element is positioned "on" another element (e.g., a layer is "on" another layer or "on" a substrate), a further component (e.g., a further layer) may be positioned between the two elements (e.g., a further layer may be positioned between a layer and a substrate if the layer is "on" said substrate).

For example, a silicon controlled rectifier, SCR may include a semiconductor body having a first main surface. The SCR may further include an active device region. The SCR may further include a first, a second, a third and a fourth surface contact area at the first main surface arranged directly one after another along a first lateral direction. The semiconductor body may be electrically contacted at each of the first to fourth surface contact areas. The SCR may further include a first, a second, a third and a fourth SCR region. The first and third SCR regions are of a first conductivity type and may directly adjoin the first and third surface contact area, respectively. The second and fourth SCR regions are of a second conductivity type and may directly adjoin the second and fourth surface contact area, respectively. The SCR may further include a first well region of the first conductivity type. The second SCR region may at least partially overlap the first well region at the first main surface. The first SCR region may at most partially overlap the first well region at the first main surface. The first SCR region may be electrically connected to the second SCR region. The third SCR region may be electrically connected to the fourth SCR region.

For example, the silicon controlled rectifier may be an ESD protection device. The silicon controlled rectifier may be formed by a CMOS (Complementary Metal Oxide Semiconductor) technology or by a family of processes, each of which combines the strengths of different process technologies onto a single chip: Bipolar for precise analog functions, CMOS (Complementary Metal Oxide Semiconductor) for digital design and DMOS (Double Diffused Metal Oxide Semiconductor) for power and high-voltage elements. These mixed processes are also known as BCD (Bipolar CMOS DMOS) technology or Smart Power Technology (SPT), or BiCMOS when combining Bipolar and CMOS technology.

For example, the silicon controlled rectifier may be a uni-directional (or single direction) silicon controlled rectifier complying with either positive or negative operating voltages at the same pin.

The semiconductor body may include or consist of a semiconductor material from the group IV elemental semiconductors, IV-IV compound semiconductor material, III-V compound semiconductor material, or II-VI compound semiconductor material. Examples of semiconductor materials from the group IV elemental semiconductors include, inter alia, silicon (Si) and germanium (Ge). Examples of IV-IV compound semiconductor materials include, inter alia, silicon carbide (SiC) and silicon germanium (SiGe). Examples of III-V compound semiconductor material include, inter alia, gallium arsenide (GaAs), gallium nitride (GaN), gallium phosphide (GaP), indium phosphide (InP), indium gallium nitride (InGaN) and indium gallium arsenide (InGaAs). Examples of II-VI compound semiconductor materials include, inter alia, cadmium telluride (CdTe), mercury-cadmium-telluride (CdHgTe), and cadmium magnesium telluride (CdMgTe).

The active device region may be a part of the semiconductor body where all semiconductor regions of the silicon controlled rectifier, i.e. the first to fourth SCR regions are included. The active device region may be electrically connected by a corresponding part of the semiconductor body at the first main surface, e.g. at the first to fourth surface contact areas. When arranging the first, the second, the third and the fourth surface contact area directly one after another along the lateral direction, these surface contact areas may be the only surface contact areas along a lateral extent from the first to the fourth surface contact areas where the active device area is electrically connected at the first main surface. For example, no additional surface contact areas to the active device region may be arranged between any neighboring two of the first to fourth surface contact areas along the lateral direction. In other words, no additional surface contact area is arranged between the first and second surface contact area, or between the second and third surface contact area, or between the third and fourth surface contact area. This may allow for a compact SCR design, for example. For example, at each of the first to fourth surface contact areas an electric contact may be provided either to a p-doped region or to an n-doped region. According to an example, a first contact may be electrically connected to only a p-doped region at the first surface contact area, e.g. to a p-doped first SCR region. A second contact may be electrically connected to only an n-doped region at the second surface contact area, e.g. to an n-doped second SCR region. A third contact may be electrically connected to only a p-doped region at the third surface contact area, e.g. to a p-doped third SCR region. A fourth contact may be electrically connected to only an n-doped region at the fourth surface contact area, e.g. to an n-doped fourth SCR region. According to another example, a first contact may be electrically connected to only an n-doped region at the first surface contact area, e.g. to an n-doped first SCR region. A second contact may be electrically connected to only a p-doped region at the second surface contact area, e.g. to a p-doped second SCR region. A third contact may be electrically connected to only an n-doped region at the third surface contact area, e.g. to an n-doped third SCR region. A fourth contact may be electrically connected to only a p-doped region at the fourth surface contact area, e.g. to a p-doped fourth SCR region.

Each of the first to fourth contacts may include one or more conducting materials, e.g. one or a combination of metals, metal alloys or highly doped semiconductors. For example, the one or more conducting materials of each of the first to fourth contacts may be arranged as a conducting filling in a contact opening or pattern of contact openings that are formed in an intermediate dielectric directly arranged on the first main surface. For example, each of the first to fourth contacts may correspond to an array of contact plugs or contact lines that directly adjoin the semiconductor body at the first main surface, for example.

For example, the first well region may extend further along a direction perpendicular to the first lateral direction, e.g. a vertical direction, than each of the first and second SCR regions. For example, the first well region may have a maximum doping concentration smaller than each of the first and second SCR regions.

When the second SCR region partially overlaps the first well region at the first main surface, a first part of the second SCR region laterally protrudes over the first well region at the first main surface while a second part of the second SCR region is congruent with at least part of the first well region. For example, a lateral distance between the first SCR region and the second SCR region may be smaller than a lateral distance between the first SCR region and the first well region. When the second SCR region completely overlaps the first SCR region at the first main surface, the second SCR region is congruent with all or a first part of the first well region at the first main surface. A second part of the first well region may laterally protrude over the second SCR region at the first main surface. For example, a lateral distance between the first SCR region and the second SCR region may be larger than a lateral distance between the first SCR region and the first well region.

When the first SCR region at most partially overlaps the first well region at the first main surface, a first part of the first SCR region may laterally protrude over the first well region at the first main surface and a second part of the first SCR region may be congruent with a part of the first well region at the first main surface. Alternatively, there may also be no overlap between the first SCR region and the first well region at the first main surface.

The first SCR region may be electrically connected to the second SCR region by an electric connection including the first and second contacts and other conducting elements of a wiring area above the first main surface. The wiring area may include one, two, three or even more wiring levels that may include patterned metal layers and interlayer dielectrics arranged between the patterned metal layers. Vias may electrically interconnect the different wiring levels, for example. For example, a metal line formed by a part of a first metal layer of the wiring area may electrically connect the first and second contacts. The third SCR region may be electrically connected to the fourth SCR region similar to an electric connection between the first and the second SCR regions, for example.

The first SCR region and the second SCR region may form base (or base contact region) and emitter of a pnp (alternatively npn) transistor of the SCR, respectively. The third SCR region and the fourth SCR region may form emitter and base (or base contact region) of an npn (alternatively pnp) transistor of the SCR. The first SCR region may additionally form a collector contact region of the npn (alternatively pnp) transistor of the SCR and the fourth SCR region may additionally form a collector contact region of the pnp (alternatively npn) transistor of the SCR.

By adjusting the overlap between the first well region and the first and second SCR regions, an effective base resistance of the pnp (alternatively npn) transistor of the SCR between the first and second SCR regions may be adjusted, e.g. increased, for providing a compact SCR design with improved uniformity of SCR triggering. Thus, an improvement of scalability of a robustness of the SCR along an axis of device scaling, e.g. a direction along a device width, may be achieved. That is, avoidance of current filamentation and hence avoidance of early, localized failure may be achieved.

For example, a device isolation region may surround, e.g. completely surround, the active device region. This may allow for electrically insulating the active device region from neighboring active device regions. The device isolation region may be a trench isolation, e.g. a deep trench isolation (DTI), or a pn-junction isolation, for example.

For example, a silicon controlled rectifier, SCR may include a semiconductor body having a first main surface. The SCR may further include an active device region. The SCR may further include a first, a second, a third, a fourth and a fifth surface contact area at the first main surface. The first, second, fifth, third and fourth surface contact area may be arranged directly one after another along a first lateral direction. The semiconductor body may be electrically contacted at each of the first to fifth surface contact areas. The SCR may further include a first, a second, a third and a fourth SCR region. The first and third SCR regions may be of a first conductivity type and may directly adjoin the first and third surface contact area, respectively. The second and fourth SCR regions may be of a second conductivity type and may directly adjoin the second and fourth surface contact area, respectively. The SCR further may further include a trigger region of the first conductivity type that may directly adjoin the fifth surface contact area. The SCR may further include a first well region of the first conductivity type. The second SCR region may at least partially overlap the first well region at the first main surface. The first SCR region may at most partially overlap the first well region at the first main surface. The first SCR region may be electrically connected to the second SCR region. The third SCR region may be electrically connected to the fourth SCR region. The SCR may allow for injecting a trigger current from a trigger current source through the trigger region, for example.

For example, the first well region may be spaced apart from the first SCR region along the first lateral direction. This may allow for an increase of an effective base resistance of the pnp (alternatively npn) transistor of the SCR between the first and second SCR regions compared to an overlap, e.g. partial or complete overlap, of the first SCR region and the first well region. This may allow for a further improvement of uniformity of SCR triggering.

For example, the SCR may further include a second well region of the second conductivity type. The third SCR region may at least partially overlap the second well region at the first main surface. The fourth SCR region may at most partially overlap the second well region at the first main surface. By adjusting the overlap between the second well region and the third and fourth SCR regions, an effective base resistance of the npn (alternatively pnp) transistor of the SCR between the third and fourth SCR regions may be adjusted, e.g. increased, for providing a compact SCR design with improved uniformity of SCR triggering. That is, avoidance of current filamentation and hence avoidance of early, localized failure may be achieved. Details described above with respect to the first well region and the first and second SCR regions likewise apply to the second well region and the fourth and third SCR regions, respectively.

For example, the second well region may be spaced apart from the fourth SCR region along the first lateral direction. This may allow for an increase of an effective base resistance of the pnp (alternatively npn) transistor of the SCR between the third and fourth SCR regions compared to an overlap, e.g. partial or complete overlap, of the fourth SCR region and the second well region. This may allow for a further improvement of uniformity of SCR triggering.

For example, a distance between the first well region and the second well region along the first lateral direction may be in a range from 0 µm to 20 µm. Adjusting the distance may allow for setting a breakdown voltage for triggering of the SCR, for example.

For example, the SCR may further include a third well region of the second conductivity type. The third well region may extend further along a direction perpendicular to the first lateral direction than the second well region. The third well region may extend further along the first lateral direction than the second well region. The third well region may at least partially overlap the second well region at the first main surface. For example, the third well region may have a maximum doping concentration smaller than the second well region. This may allow for adjusting a deep reverse diode including the third and fourth SCR regions as cathode (alternatively anode) or anode (alternatively cathode) regions. Moreover, the third well region may further simplify adjustment of the effective base resistance of the npn (alternatively pnp) transistor of the SCR between the third and fourth SCR regions, for example.

For example, the third well region may at least partially overlap the fourth SCR region at the first main surface. This may allow for an improved electric connection of the third well region, and optionally the second well region, to the fourth contact at the first main surface via the fourth surface contact area, for example.

For example, the SCR may further include a resistor. The first SCR region and the second SCR region may be electrically connected via the resistor. An electric resistance of the resistor may be in a range from 1 Ohm to 100 Ohm. For example, the resistor may be formed in the wiring area, e.g. by polycrystalline silicon. The resistor may allow for a further adjustment of trigger behavior and may allow for a further improvement of scalability of the SCR.

For example, the SCR may further include a fourth well region of the first conductivity type. The fourth well region may extend further along a direction perpendicular to the first lateral direction than the first well region. The fourth well region may extend further along the first lateral direction than the first well region. The fourth well region may at least partially overlap the first well region at the first main surface. For example, the fourth well region may have a maximum doping concentration smaller than the first well region. This may allow for adjusting a deep reverse diode including the first and fourth SCR regions as cathode (alternatively anode) or anode (alternatively cathode) regions. Moreover, the fourth well region may further simplify adjustment of the effective base resistance of the pnp (alternatively npn) transistor of the SCR between the first and second SCR regions, for example.

For example, the fourth well region may at least partially overlap the first SCR region at the first main surface. This may allow for an improved electric connection of the third well region, and optionally the second well region, to the fourth contact at the first main surface via the fourth surface contact area, for example.

Exemplary details described with reference to the SCR examples above, e.g. details on materials, functions, arrangements or dimensions of structural elements such as semiconductor regions correspondingly apply to the SCRs described further below.

Another example of a silicon controlled rectifier, SCR may include a semiconductor body having a first main surface. The SCR may further include an active device region. The SCR may further include a first, a second, a third and a fourth surface contact area at the first main surface arranged directly one after another along a first lateral direction. The semiconductor body may be electrically contacted at each of the first to fourth surface contact areas. The SCR may further comprise a first, a second, a third and a fourth SCR region. The first and third SCR regions may be of a first conductivity type and directly adjoin the first and third surface contact area, respectively. The second and fourth SCR regions may be of a second conductivity type and directly adjoin the second and fourth surface contact area, respectively. The first SCR region may be electrically connected to the fourth SCR region. The second SCR region may be electrically connected to the third SCR region.

The first SCR region may be electrically connected to the fourth SCR region by an electric connection including the first and fourth contacts and other conducting elements of a wiring area above the first main surface. The second SCR region may be electrically connected to the third SCR region similar to an electric connection between the first and the fourth SCR regions, for example.

The first SCR region and the fourth SCR region may form emitter and base (or base contact region) of a pnp (alternatively npn) transistor of the SCR, respectively. The second SCR region and the third SCR region may form emitter and base (or base contact region) of an npn (alternatively pnp) transistor of the SCR. The fourth SCR region may additionally form a collector contact region of the npn (alternatively pnp) transistor of the SCR and the third SCR region may additionally form a collector contact region of the pnp (alternatively npn) transistor of the SCR.

The exemplary SCR may allow for a fast reverse diode formed by the third and fourth SCR regions being anode and cathode (or vice versa) of the reverse diode. This may be achieved by a close proximity between the third and fourth SCR regions, for example. In view of the spatial separation of the first and fourth SCR regions, an effective base resistance of the pnp (alternatively npn) transistor of the SCR between the first and fourth SCR regions may be adjusted, e.g. increased, for improving uniformity of SCR triggering. Thus, an improvement of scalability of a robustness of the SCR along an axis of device scaling, e.g. a direction along a device width, may be achieved.

For example, the SCR may further include a first well region of the first conductivity type. The first well region may at least partially overlap the second SCR region at the first main surface. The first well region may at most partially overlap with the third SCR region at the first main surface. By adjusting the overlap between the first well region and the second and third SCR regions, an effective base resistance of the npn (alternatively pnp) transistor of the SCR between the second and third SCR regions may be adjusted, e.g. increased, for providing a compact SCR design with improved uniformity of SCR triggering. Thus, an improvement of scalability of a robustness of the SCR along an axis of device scaling, e.g. a direction along a device width, may be achieved.

For example, the SCR may further include a second well region of the second conductivity type. The second well region may at least partially overlap the first SCR region at the first main surface. A distance between the first well region and the second well region along the first lateral direction may be in a range from 0 μm to 20 μm. This may allow for adjusting a breakdown voltage of the SCR, for example.

For example, the SCR may further include a third well region of the second conductivity type. The third well region may at least partially overlap the fourth SCR region at the first main surface. A distance between the first well region and the third well region along the first lateral direction may be in a range from 0 μm to 20 μm. This may allow for adjusting a breakdown voltage and/or a holding voltage of the SCR, for example.

For example, the active device region may comprise a semiconductor layer on a buried semiconductor layer. The active device region may be electrically isolated from neighboring active device regions by a deep trench isolation extending from the first surface main surface through the semiconductor layer and into or through the buried semiconductor layer. A maximum doping concentration of the buried semiconductor layer may be larger than a maximum doping concentration of the semiconductor layer. The active device region may be part of an integrated circuit formed by a BCD or SPT technology, for example.

The examples and features described above and below may be combined.

The aspects and features mentioned and described together with one or more of the previously described examples and figures, may as well be combined with one or more of the other examples in order to replace a like feature of the other example or in order to additionally introduce the feature to the other example. For example, exemplary details described with reference to the SCR examples above, e.g. details on materials, functions, arrangements or dimensions of structural elements such as semiconductor regions correspondingly apply to the SCRs described further below with reference to the drawings.

The description and drawings merely illustrate the principles of the disclosure. Furthermore, all examples recited herein are principally intended expressly to be only for illustrative purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

FIG. 1 illustrates an exemplary SCR 1000. The SCR 1000 includes a semiconductor body 102 having a first main surface 104. The SCR 1000 further includes an active device region 106. The active device region 106 may be electrically isolated from neighboring active device regions by a device isolation region (not illustrated in FIG. 1). The SCR 1000 further includes a first, a second, a third and a fourth surface contact area 1081, 1082, 1083, 1084 at the first main surface 104 arranged directly one after another along a first lateral direction x1. A second lateral direction perpendicular to the first lateral direction x1 may be an axis of device scaling, e.g. a direction along a device width.

The semiconductor body 102 is electrically contacted at each of the first to fourth surface contact areas 1081, 1082, 1083, 1084 by a first, a second, a third, and a fourth contact 1141, 1142, 1143, 1144, respectively.

The SCR further includes a first, a second, a third and a fourth SCR region 1101, 1102, 1103, 1104. The first and third SCR regions 1101, 1103 are $n^+$-doped and directly adjoin the first and third surface contact area 1081, 1083, respectively.

The second and fourth SCR regions 1102, 1104 are $p^+$-doped and directly adjoin the second and fourth surface contact area 1082, 1084, respectively.

The SCR 1000 further includes an n-doped first well region 112. The second SCR region 1102 at least partially overlaps the first well region 112 at the first main surface 104. The second SCR region 1102 completely overlaps the first well region 112 at the first main surface 104 in the exemplary illustration of the first well region 112 by a solid line. The second SCR region 1102 partially overlaps the first well region 112 at the first main surface 104 in the exemplary illustration of the first well region 112 that includes a dashed line extending through the second SCR region 1102.

The first SCR region 1101 at most partially overlaps the first well region 112 at the first main surface 104. The first SCR region 1101 has no overlap with the first well region 112 at the first main surface 104 in the exemplary illustration of the first well region 112 by a solid line. The first SCR region 1101 partially overlaps the first well region 112 at the first main surface 104 in the exemplary illustration of the first well region 112 that includes a dashed line extending through the first SCR region 1101.

The first SCR region 1101 is electrically connected to the second SCR region 1102 by an electric connection including the first and second contacts 1141, 1142 and a first wiring line 1161. The third SCR region 1103 is electrically connected to the fourth SCR region 1104 by an electric connection including the third and fourth contacts 1143, 1144 and a second wiring line 1162.

The SCR 1000 may include further semiconductor regions, e.g. a p-well region surrounding the third SCR region 1103, that are not illustrated in the simplified view of FIG. 1.

Figure 2:
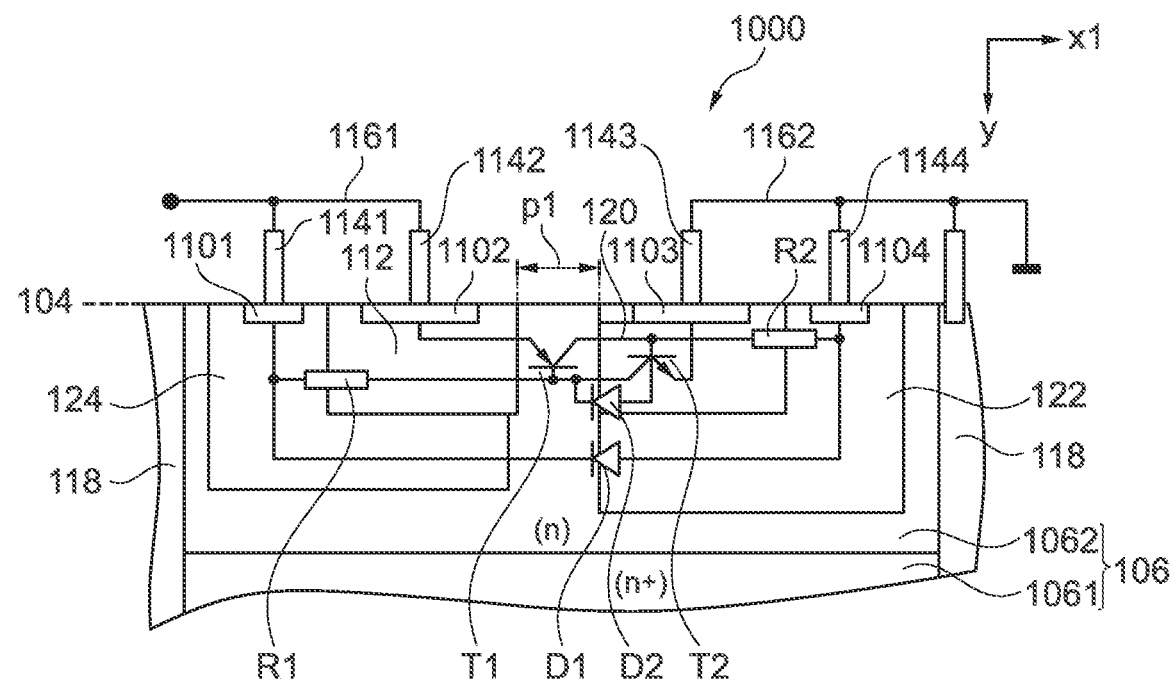
FIG. 2 is a cross-sectional view of a more detailed example of the silicon controlled rectifier of FIG. 1.

A more detailed view of an example of the SCR 1000 is illustrated in the schematic cross-sectional view of FIG. 2.

Referring to FIG. 2, the active device region 106 is electrically isolated from neighboring active device regions by a device isolation structure, e.g. a trench isolation structure 118. The trench isolation structure 118 may be a trench isolation structure including a conductive filling electrically isolated from laterally surrounding semiconductor material by a dielectric. This may allow for a double function of the trench isolation structure 118 being a device isolation and substrate contact. The active device region 106 includes an $n^+$-doped buried layer 1061 and an n-doped layer 1062 between the $n^+$-doped buried layer 1061 and the first main surface 104. The SCR 1000 may be formed by a BCD or SPT technology, for example.

The SCR 1000 further includes a p-doped second well region 120. The third SCR region 1103 at least partially overlaps the second well region 120 at the first main surface 104. In the exemplary illustration of FIG. 2, the third SCR region 1103 completely overlaps the second well region 120 at the first main surface 104. The fourth SCR region 1104 at most partially overlaps the second well region 120 at the first main surface 104. In the exemplary illustration of FIG. 2, The fourth SCR region 1104 has no overlap with the second well region 120 at the first main surface 104.

By adjusting the overlap between the first well region 112 and the first and second SCR regions 1101, 1102, an effective base resistance R1 of a pnp transistor T1 of the SCR 1000 between the first and second SCR regions 1101, 1102 may be adjusted, e.g. increased, for providing a compact SCR design with improved uniformity of SCR triggering. That is, avoidance of current filamentation and hence avoidance of early, localized failure may be achieved.

By adjusting the overlap between the second well region 120 and the third and fourth SCR regions 1103, 1104, an effective base resistance R2 of an npn transistor of the SCR 1000 between the third and fourth SCR regions 1103, 1104 may be adjusted, e.g. increased, for providing a compact SCR design with improved uniformity of SCR triggering. That is, avoidance of current filamentation and hence avoidance of early, localized failure may be achieved.

In the exemplary SCR 1000 illustrated in FIG. 2, the second well region 120 is spaced apart from the fourth SCR region 1104 along the first lateral direction x1.

A first lateral distance p1 between the first well region 112 and the second well region 120 along the first lateral direction x1 may be appropriately adjusted for setting a holding voltage of the SCR 1000 toward a target value, for example.

The exemplary SCR 1000 illustrated in FIG. 2 further includes a p-doped third well region 122. The third well region 122 extends further along a direction perpendicular to the first lateral direction, e.g. a vertical direction y, than the second well region 120. The third well region 122 extends further along the first lateral direction x1, e.g. has a larger lateral extent, than the second well region 120. The third well region 122 at least partially overlaps the second well region 120 at the first main surface 104. For example, the third well region 122 may have a maximum doping concentration smaller than the second well region 120. This may allow for adjusting a deep reverse diode D1 including the first and fourth SCR regions 1101, 1104 as anode and cathode regions, for example. A shallow reverse diode D2 may be formed between the first and second well regions 112, 120, for example. Moreover, the third well region 122 may further simplify adjustment of the effective base resistance R2 of the npn transistor T2 of the SCR 1000 between the third and fourth SCR regions 1103, 1104, for example.

The exemplary SCR 1000 illustrated in FIG. 2 further includes an n-doped fourth well region 124. The fourth well region 124 extends further along the vertical direction y than the first well region 112. The fourth well region 124 extends further along the first lateral direction x1, e.g. has a larger lateral extent, than the first well region 112. The fourth well region 124 at least partially overlaps the first well region 112 at the first main surface 104. For example, the fourth well region 124 may have a maximum doping concentration smaller than the first well region 112. This may allow for adjusting the deep reverse diode D1 including the first and fourth SCR regions 1101, 1104 as anode and cathode regions, for example. Moreover, the fourth well region 124 may further simplify adjustment of the effective base resistance R1 of the pnp transistor T1 of the SCR 1000 between the first and second SCR regions 1101, 1102, for example.

Figure 3:
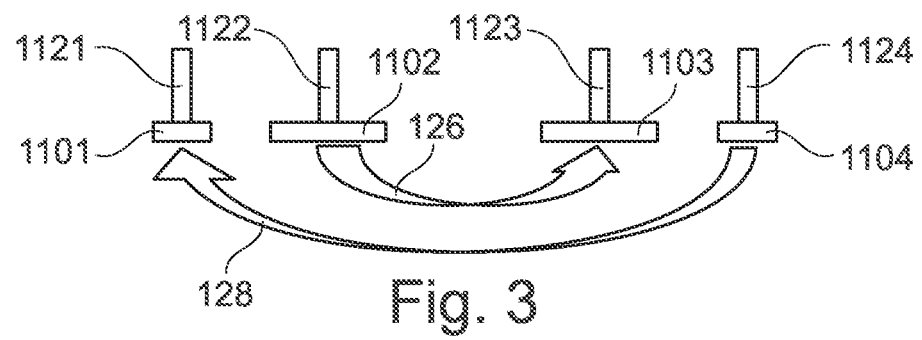
FIG. 3 is a simplified view for illustrating current paths when operating the silicon controlled rectifiers of FIGS. 1 and 2 in forward current or reverse current mode.

FIG. 3 is a simplified illustration of current flow directions during operation modes of the SCR 1000 of FIGS. 1 and 2. A first arrow 126 indicates a forward current flow direction when the SCR 1000 including the pnp and npn transistors T1, T2 is turned on. A second arrow 128 indicates a reverse current flow direction of the deep reverse diode D1 and the shallow reverse diode D2 of the SCR 1000.

Figure 4:
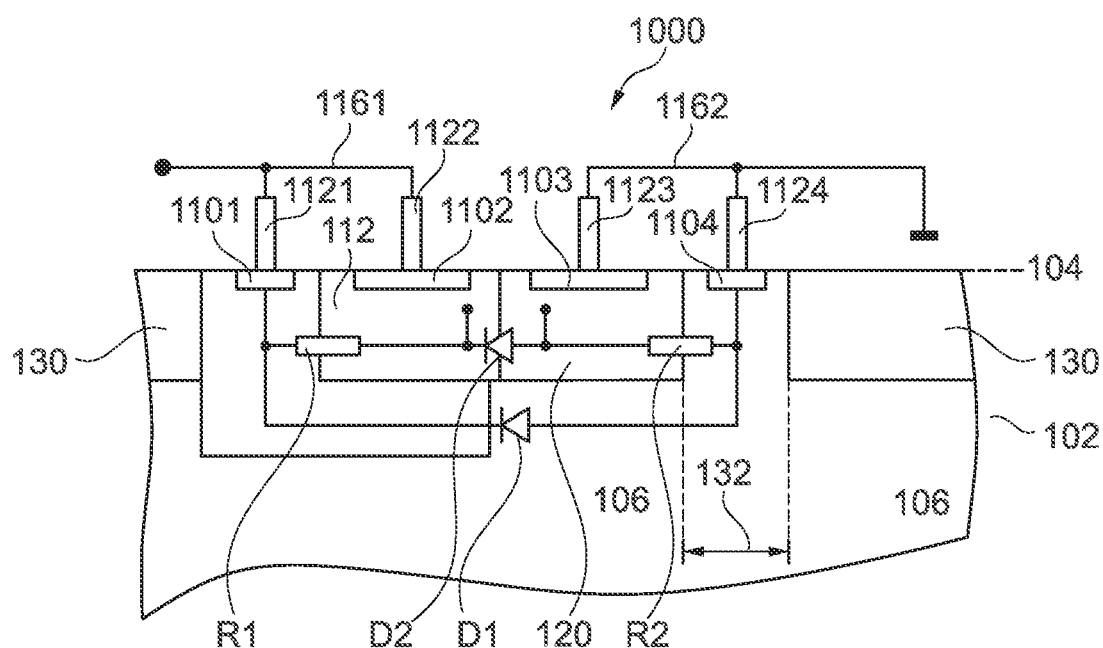
FIG. 4 is another cross-sectional view of a more detailed example of the silicon controlled rectifier of FIG. 1.

Another more detailed view of an example of the SCR 1000 is illustrated in the schematic cross-sectional view of FIG. 4.

Referring to FIG. 4, the active device region 106 includes a p-doped semiconductor layer, e.g. a p-doped substrate. P-well regions 130 may be arranged between may be arranged between neighboring active device areas, for example. The SCR 1000 may be formed by a CMOS technology, for example. The p-well regions 130 and the second well region 120 may be concurrently formed by a masked ion implantation process, for example. The mask may block the dopants from entering the semiconductor body 102 in a blocking area 132 below the fourth SCR region 1104 that is arranged between the second well region 120 and the p-well region 130, for example. This may allow for adjusting the effective base resistance R2 of the npn transistor T2 of the SCR 1000 between the third and fourth SCR regions 1103, 1104, for example.

Figure 5:
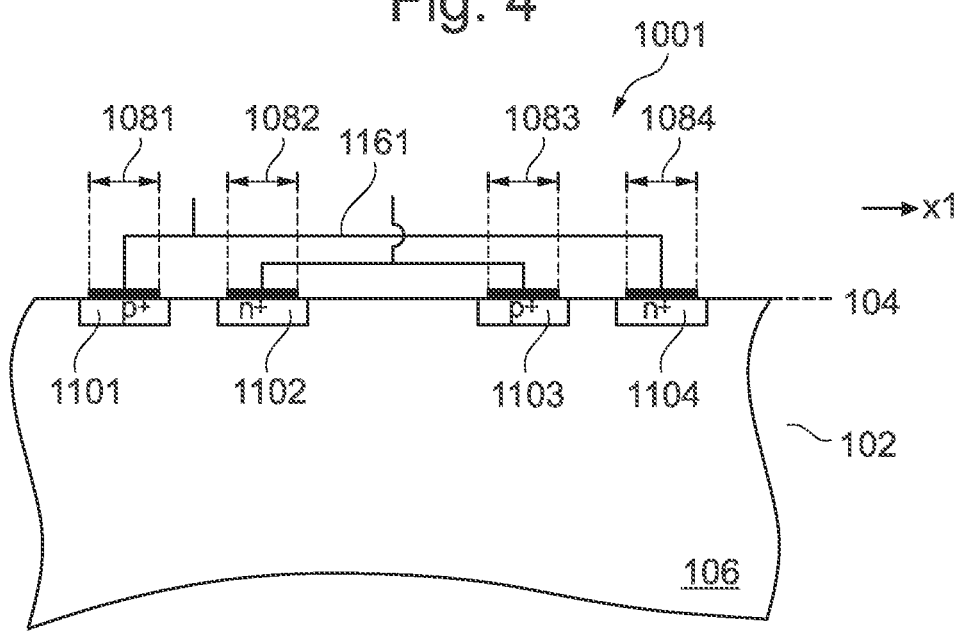
FIG. 5 illustrates a schematic cross-sectional view of another example of a silicon controlled rectifier.

FIG. 5 illustrates another exemplary SCR 1001. The SCR 1001 includes a semiconductor body 102 having a first main surface 104. The SCR 1001 further includes an active device region 106. The SCR 1001 further includes a first, a second, a third and a fourth surface contact area 1081, 1082, 1083, 1084 at the first main surface arranged directly one after another along a first lateral direction x1. A second lateral direction perpendicular to the first lateral direction x1 may be an axis of device scaling, e.g. a direction along a device width.

The semiconductor body 102 is electrically contacted at each of the first to fourth surface contact areas 1081, 1082, 1083, 1084 by a first, a second, a third, and a fourth contact 1141, 1142, 1143, 1144, respectively.

The SCR further includes a first, a second, a third and a fourth SCR region 1101, 1102, 1103, 1104. The first and third SCR regions 1101, 1103 are p$^+$-doped and directly adjoin the first and third surface contact area 1081, 1083, respectively.

The second and fourth SCR regions 1102, 1104 are n$^+$-doped and directly adjoin the second and fourth surface contact area 1082, 1084, respectively.

The first SCR region 1101 is electrically connected to the fourth SCR region 1104 by an electric connection including the first and fourth contacts 1141, 1144 and a first wiring line 1161. The second SCR region 1102 is electrically connected to the third SCR region 1103 by an electric connection including the second and third contacts 1142, 1143 and a second wiring line 1162.

The SCR 1001 may include further semiconductor regions, e.g. a p-well region surrounding the second and third SCR region 1102, 1103 that are not illustrated in the simplified view of FIG. 5.

Figure 6:
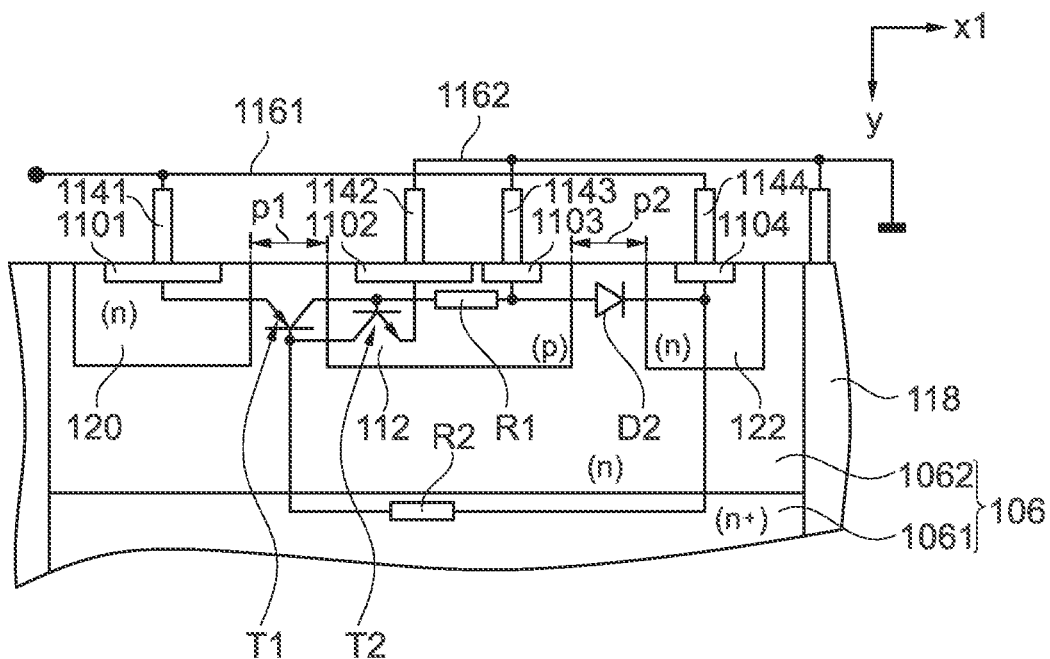
FIG. 6 is a cross-sectional view of a more detailed example of the silicon controlled rectifier of FIG. 5.

A more detailed view of an example of the SCR 1001 is illustrated in the schematic cross-sectional view of FIG. 6.

Referring to FIG. 6, the active device region 106 is electrically isolated from neighboring active device regions by a device isolation structure, e.g. a trench isolation structure 118. The trench isolation structure 118 may be a trench isolation structure including a conductive filling electrically isolated from laterally surrounding semiconductor material by a dielectric. This may allow for a double function of the trench isolation structure 118 being a device isolation and substrate contact. The active device region 106 includes an n$^+$-doped buried layer 1061 and an n-doped layer 1062 between the n$^+$-doped buried layer 1061 and the first main surface 104. The SCR 1000 may be formed by a BCD or SPT technology, for example.

The SCR 1001 further includes a p-doped first well region 112. The first well region 112 at least partially overlaps the second SCR region 1102 at the first main surface 104. The first well region 112 at most partially overlaps with the third SCR region 1103 at the first main surface 104.

The SCR 1001 further includes an n-doped second well region 120. The second well region at least partially overlaps the first SCR region 1101 at the first main surface 104. A first lateral distance p1 between the first well region 112 and the second well region 120 along the first lateral direction x1 may be appropriately adjusted for setting a breakdown voltage of the SCR 1001, for example.

The SCR 1001 further includes an n-doped third well region 122. The third well region 122 at least partially overlaps the fourth SCR region 1104 at the first main surface 104. A second lateral distance p2 between the first well region 112 and the third well region 122 along the first lateral direction x1 may be appropriately adjusted for setting a breakdown voltage of the SCR 1001 and for setting target characteristics of the shallow reverse diode D2, for example.

Figure 7:
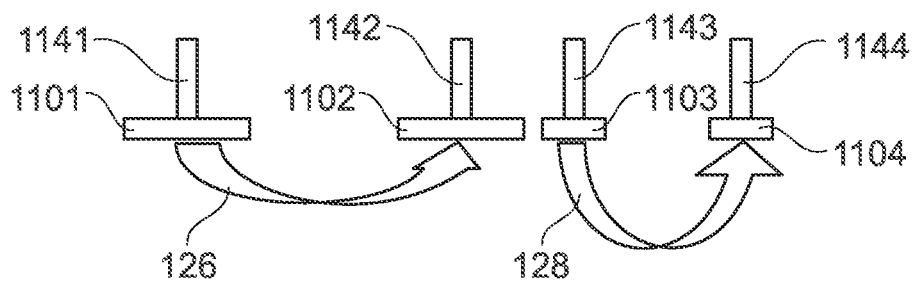
FIG. 7 is a simplified view for illustrating current paths when operating the silicon controlled rectifiers of FIGS. 5 and 6 in forward current or reverse current mode.

FIG. 7 is a simplified illustration of current flow directions during operation modes of the SCR 1001 of FIGS. 5 and 6. A first arrow 126 indicates a forward current flow direction when the SCR 1001 including the pnp and npn transistors T1, T2 is turned on. A second arrow 128 indicates a reverse current flow direction of the shallow reverse diode D2 of the SCR 1001.

Figure 8B:
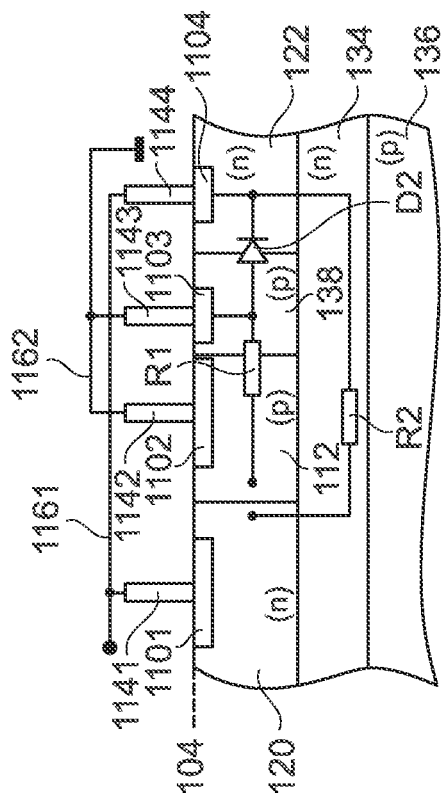
FIGS. 8A to 8D are schematic cross-sectional views of more detailed examples of the silicon controlled rectifier of FIG. 5.
Figure 8D:
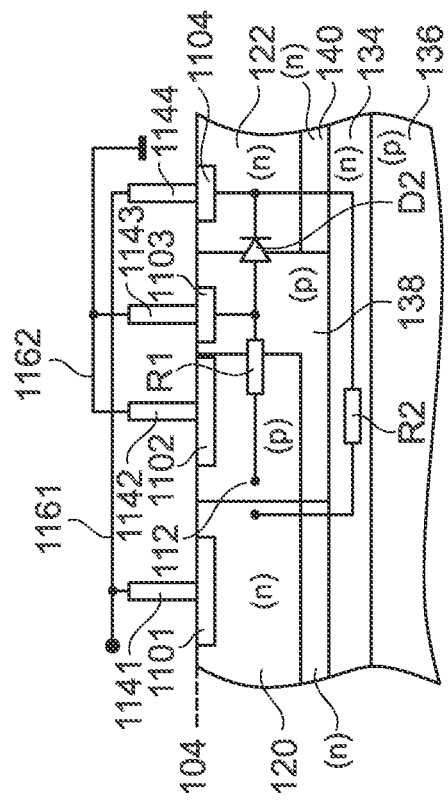
Figure 8A:
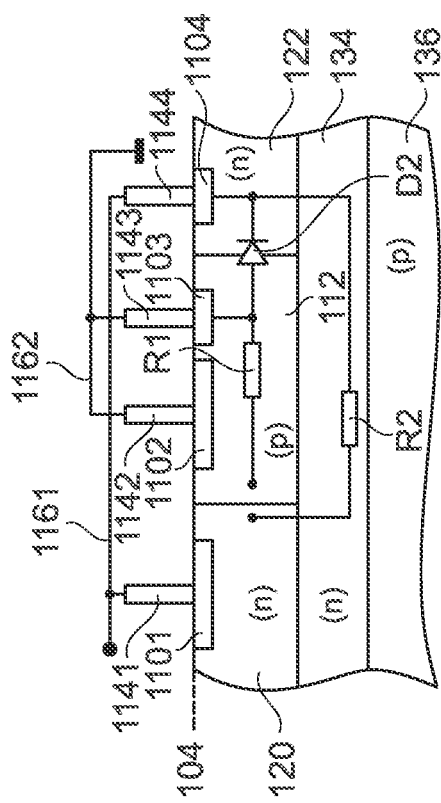
Figure 8C:
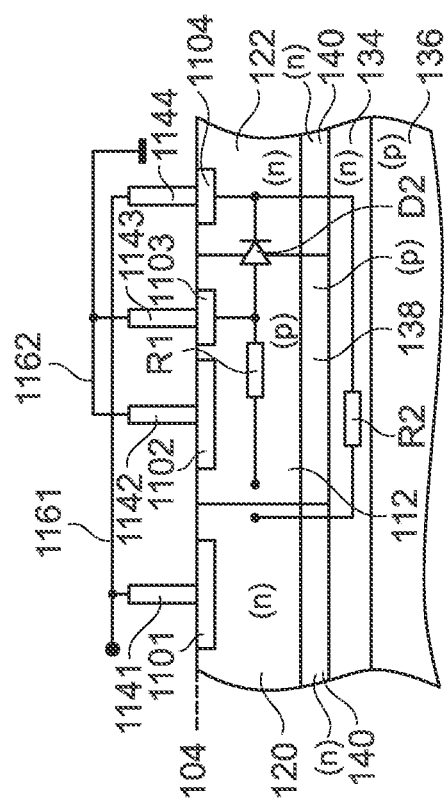

FIGS. 8A to 8D are cross-sectional views for illustrating further examples based on modifications of the SCR 1001 of FIG. 6. The SCRs illustrated in FIGS. 8A and 8D include a deep n-doped well region 134 on a p-doped substrate 136. By adjusting ion implantation parameters, e.g. ion implantation energy, a vertical distance between the deep n-doped well region 134 and the first main surface 104 may be adjusted, for example. Referring to FIGS. 8B and 8D, the first well region 112 may also be partly blocked during ion implantation. Adjustment of the deep n-doped well region 134 and blocking the first well region 112 may lead to a lightly p-doped region 138 below and/or laterally adjoining the first well region 112. A doping concentration of the lightly p-doped region 138 may correspond to the doping concentration of the p-doped substrate 136. By forming the lightly p-doped region 138 the first resistance R1 may be adjusted, e.g. in CMOS or BiCMOS technologies. Referring to FIGS. 8C and 8D, an n-doped interconnection region 140 may be formed between the deep n-doped well region 134 and each of the second and third well region 120, 122, for example. This may support use of the SCR 1001 for BiCMOS technologies, for example.

Figure 9:
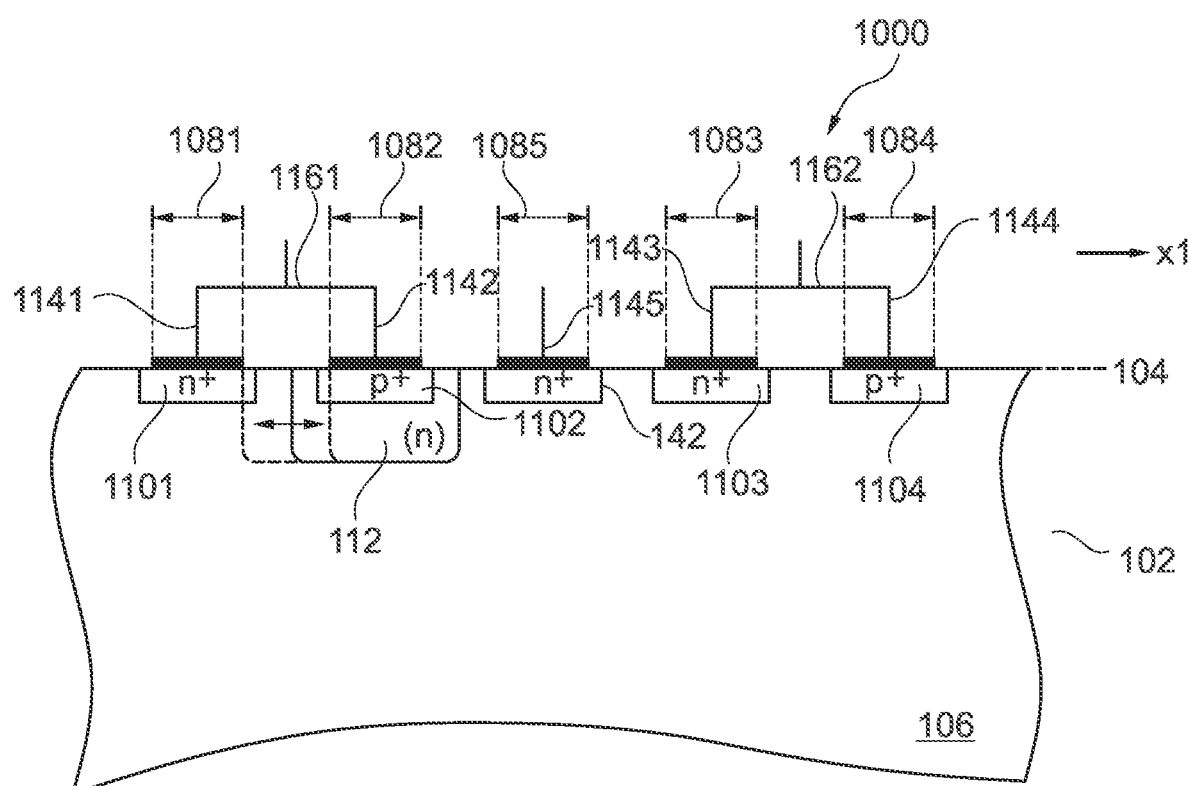
FIG. 9 illustrates a schematic cross-sectional view of an example of a silicon controlled rectifier including a trigger region.

Another exemplary SCR 1000 is illustrated in the schematic cross-sectional view of FIG. 9. The exemplary SCR 1000 illustrated in FIG. 9 differs from the SCR of FIG. 1 by a fifth surface contact area 1085 that is arranged between the second and third surface contact areas 1082, 1083. An n$^+$-doped trigger region 142 is electrically contacted at the fifth surface contact area 1085 by a fifth contact 1145. A trigger current may be injected via the trigger region 142, for example.

In the illustrated examples, triggering of the SCR may be caused by avalanche breakdown between p- and n-doped regions. Other trigger schemes where the trigger current is injected from other trigger current sources may alternatively or additionally be used.

In the illustrated examples of the drawings a doping type of the semiconductor regions may also be reversed, i.e. an n-doped region may be formed as a p-doped region, and a p-doped region may be formed as an n-doped region, for example.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. A silicon controlled rectifier (SCR), comprising:
a semiconductor body including a first main surface;
an active device region;
a first, a second, a third, a fourth and a fifth surface contact area at the first main surface, wherein the first, second, fifth, third and fourth surface contact areas are arranged directly one after another along a first lateral direction, and wherein the semiconductor body is electrically contacted at each of the first to fifth surface contact areas;
a first, a second, a third and a fourth SCR region, wherein the first and third SCR regions are of a first conductivity type and directly adjoin the first and third surface contact areas, respectively, and wherein the second and fourth SCR regions are of a second conductivity type and directly adjoin the second and fourth surface contact areas, respectively;
a trigger region of the first conductivity type that directly adjoins the fifth surface contact area; and
a first well region of the first conductivity type, wherein the second SCR region at least partially overlaps the first well region at the first main surface, and the first SCR region at most partially overlaps the first well region at the first main surface,
wherein the first SCR region is electrically connected to the second SCR region, and the third SCR region is electrically connected to the fourth SCR region.

2. The SCR of claim 1, wherein the first well region is spaced apart from the first SCR region along the first lateral direction.

3. The SCR of claim 1, further comprising a second well region of the second conductivity type, wherein the third SCR region at least partially overlaps the second well region at the first main surface, and wherein the fourth SCR region at most partially overlaps the second well region at the first main surface.

4. The SCR of claim 3, wherein the second well region is spaced apart from the fourth SCR region along the first lateral direction.

5. The SCR of claim 1, further comprising a third well region of the second conductivity type, wherein the third well region extends further along a direction perpendicular to the first lateral direction than the second well region, wherein the third well region extends further along the first lateral direction than the second well region, and wherein the third well region at least partially overlaps the second well region at the first main surface.

6. The SCR of claim 5, wherein the third well region at least partially overlaps the fourth SCR region at the first main surface.

7. The SCR of claim 1, further comprising a fourth well region of the first conductivity type, wherein the fourth well region extends further along a direction perpendicular to the first lateral direction than the first well region, wherein the fourth well region extends further along the first lateral direction than the first well region, and wherein the fourth well region at least partially overlaps the first well region at the first main surface.

* * * * *